United States Patent
Kaneko

(10) Patent No.: US 10,395,957 B2
(45) Date of Patent: Aug. 27, 2019

(54) SUBSTRATE PROCESSING APPARATUS, SUBSTRATE PROCESSING METHOD AND STORAGE MEDIUM

(71) Applicant: Tokyo Electron Limited, Tokyo (JP)

(72) Inventor: Tomohiro Kaneko, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 609 days.

(21) Appl. No.: 14/338,558

(22) Filed: Jul. 23, 2014

(65) Prior Publication Data
US 2015/0027638 A1  Jan. 29, 2015

(30) Foreign Application Priority Data
Jul. 24, 2013 (JP) .................................. 2013-153930

(51) Int. Cl.
*H01L 21/02* (2006.01)
*H01L 21/67* (2006.01)

(52) U.S. Cl.
CPC ............. *H01L 21/67276* (2013.01); *G05B 2219/32063* (2013.01); *G05B 2219/45031* (2013.01)

(58) Field of Classification Search
CPC .... H01L 21/67276; G05B 2219/32063; G05B 2219/45031
See application file for complete search history.

(56) References Cited

U.S. PATENT DOCUMENTS

| | | | |
|---|---|---|---|
| 7,536,233 B1* | 5/2009 | Krishnaswamy | G05B 19/41875 318/571 |
| 2004/0078109 A1* | 4/2004 | Babikian | G05B 19/41865 700/121 |
| 2007/0176265 A1* | 8/2007 | Takano | H01L 21/67276 257/618 |
| 2007/0250202 A1* | 10/2007 | Kaneko | H01L 21/67276 700/121 |

FOREIGN PATENT DOCUMENTS

JP  2010-283285 A  12/2010

\* cited by examiner

*Primary Examiner* — Parviz Hassanzadeh
*Assistant Examiner* — Nathan K Ford
(74) *Attorney, Agent, or Firm* — Pearne & Gordon LLP

(57) ABSTRACT

A substrate processing unit 14 includes processing modules 2 each performing a process on a substrate, and a substrate transfer device 121 is provided between a mounting unit 11 and the processing modules. A parameter storage unit 3 stores sets of transfer parameter 33 where an operating speed of the substrate transfer device corresponds to a processing number of substrates per a unit time. A parameter selecting unit 4 compares a processing number of substrates per a unit time determined based on a recipe 31 corresponding to the process, with those corresponding to the transfer parameters and selects a transfer parameter corresponding to the minimum processing number of substrates among the processing numbers of substrates equal to or larger than that determined based on the recipe. A transfer control units 151 to 153 control the substrate transfer device based on a set value of the selected transfer parameter.

5 Claims, 12 Drawing Sheets

FIG. 6

LIST OF TRANSFER PARAMETER

| | |
|---|---|
| 100 wph | SET VALUE FOR 100 wph |
| 150 wph | SET VALUE FOR 150 wph |
| 200 wph | SET VALUE FOR 200 wph |
| 250 wph | SET VALUE FOR 250 wph |
| ⋮ | ⋮ |

SET VALUE OF TRANSFER PARAMETER

| | | |
|---|---|---|
| X DIRECTION | $v_x$ | [mm/s] |
| ACCELERATION IN X DIRECTION | $a_x$ | [mm/s$^2$] |
| Y DIRECTION | $v_y$ | [mm/s] |
| ACCELERATION IN Y DIRECTION | $a_y$ | [mm/s$^2$] |
| Z DIRECTION | $v_z$ | [mm/s] |
| ACCELERATION IN Z DIRECTION | $a_z$ | [mm/s$^2$] |
| θ DIRECTION | $v_\theta$ | [rad/s] |
| ACCELERATION IN θ DIRECTION | $a_\theta$ | [rad/s$^2$] |

33

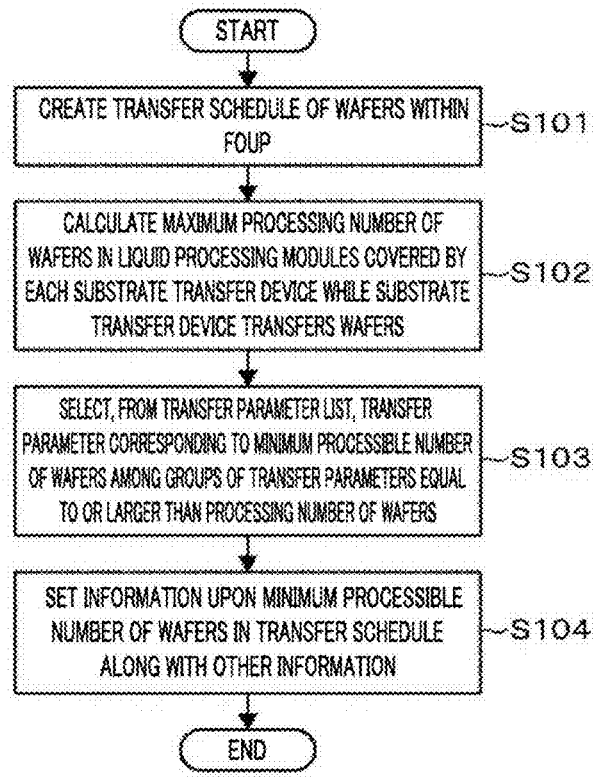

FIG. 10

PROCESSING RECIPE

| P1 | CHEMICAL LIQUID PROCESS | $t_1$ | [s/w] |
| P2 | RINSE PROCESS | $t_2$ | [s/w] |
| P3 | DRY PROCESS | $t_3$ | [s/w] |

—31

LIQUID PROCESSING TIME
$T = t_1 + t_2 + t_3$

THROUGHPUT
3600[s/h] / (T[s/w] / NUMBER OF LIQUID PROCESSING MODULES)

FIG. 11

START
↓
CREATE TRANSFER SCHEDULE OF WAFERS WITHIN FOUP —S101
↓
CALCULATE MAXIMUM PROCESSING NUMBER OF WAFERS IN LIQUID PROCESSING MODULES COVERED BY EACH SUBSTRATE TRANSFER DEVICE WHILE SUBSTRATE TRANSFER DEVICE TRANSFERS WAFERS —S102
↓
SELECT, FROM TRANSFER PARAMETER LIST, TRANSFER PARAMETER CORRESPONDING TO MINIMUM PROCESSABLE NUMBER OF WAFERS AMONG GROUPS OF TRANSFER PARAMETERS EQUAL TO OR LARGER THAN PROCESSING NUMBER OF WAFERS —S103
↓
SET INFORMATION UPON MINIMUM PROCESSABLE NUMBER OF WAFERS IN TRANSFER SCHEDULE ALONG WITH OTHER INFORMATION —S104
↓
END

SUBSTRATE PROCESSING APPARATUS, SUBSTRATE PROCESSING METHOD AND STORAGE MEDIUM

CROSS-REFERENCE TO RELATED APPLICATION

This application claims the benefit of Japanese Patent Application No. 2013-153930 filed on Jul. 24, 2013, the entire disclosures of which are incorporated herein by reference.

TECHNICAL FIELD

The embodiments described herein pertain generally to a technique of transferring a substrate into a processing module, in which a process is performed on the substrate, by using a substrate transfer device.

BACKGROUND

A substrate processing apparatus configured to perform various processes such as cleaning, coating of resist, development after exposure, and so forth on a semiconductor wafer (hereinafter, simply referred to as "wafer") as a substrate includes a substrate transfer device which is configured to transfer the wafer to be processed from a carrier accommodating the wafer to a processing module in which the various processes are performed.

In such a substrate processing apparatus, there is set a maximum value of the number of wafers capable of being processed per a unit time (in the following description, the number of wafers capable of being processed for about an hour (wph) will be referred to as "throughput"), which is determined based on the number of processing modules provided in the apparatus, a processing time, and the like. An operating speed of the wafer transfer device is set to be high enough not to generate standby time caused by the operation of the wafer transfer device itself when the processing modules are operated under the conditions for achieving the maximum throughput.

In the actual substrate processing apparatus, however, the time required to complete a process in a processing module may vary depending on the content of the process or set processing conditions. The processing module may not always be operated under the conditions of achieving the maximum throughput. If the operating speed of the wafer transfer device is set to be the high value of achieving the maximum throughput even under the processing conditions where the maximum throughput can be achieved, the wafer transfer device may be overloaded, so that wear-out of components of the wafer transfer device may be advanced.

To solve this problem, Patent Document 1 describes a technique of decreasing a transfer speed of a substrate transfer device when the standby time is generated because a process in a processing chamber is not completed, in case of transferring a substrate between the processing chamber (processing module) configured to perform the process and a load lock chamber (front end module) configured to be switched between a normal pressure atmosphere and a vacuum atmosphere in a processing apparatus of performing an etching process on a glass substrate for use in a FPD (Flat Panel Display).

Patent Document 1: Japanese Patent Laid-open Publication No. 2010-283285 (paragraphs [0046] to [0050] and FIG. 7)

In Patent Document 1, in relation to the etching process time in the processing chamber, when the standby time is generated in replacing the substrate within the processing chamber, the operating speed of the substrate transfer device is reduced to make the timing when the etching of the current substrate is completed and the timing when a next substrate arrives at the processing chamber coincident. As in this case, however, if the operating speed of the substrate transfer device is easily changed in consideration of the timing when the etching process is completed, the operating speed of the substrate transfer device may be changed to an operating speed at which an operation check is not made. The operating speed at which the operation check is not made may result in a failure of a substrate transfer. Thus, there has been a demand for a technique capable of altering the operating speed of the substrate transfer device while guaranteeing reliability of the substrate transfer.

SUMMARY

In view of the foregoing, example embodiments provide a substrate processing apparatus and a substrate processing method capable of changing an operating speed of a substrate transfer device according to a processing time of a substrate with high transfer reliability, and the example embodiments also provide a storage medium storing the substrate processing method.

In one example embodiment, a substrate processing apparatus including a mounting unit configured to mount thereon substrates to be processed; a substrate processing unit including a plurality of processing modules each configured to perform a process on the substrate; a substrate transfer device provided between the mounting unit and the processing modules; a parameter storage unit configured to store plural sets of transfer parameter in which a set value of an operating speed of the substrate transfer device based on a processing number of substrates in the substrate processing unit corresponds to a processing number of substrates per a unit time in the substrate processing unit; a parameter selecting unit configured to compare a processing number of substrates per a unit time in the substrate processing unit, which is determined based on a recipe corresponding to the process performed on the substrate, with the processing numbers of substrates corresponding to the transfer parameters stored in the parameter storage unit, and configured to select, from the parameter storage unit, a transfer parameter corresponding to the minimum processing number of substrates among the processing numbers of substrates corresponding to the transfer parameters each having the processing number of substrates equal to or larger than the processing number of substrates determined based on the recipe; and a transfer control unit configured to control the substrate transfer device based on a set value of the transfer parameter selected by the parameter selecting unit.

In the substrate processing apparatus includes following configurations. When substrates having different processing times coexist in the processing modules within the substrate processing unit, the parameter selecting unit may select the transfer parameter based on a result of comparing the processing number of substrates determined based on the recipe performed on the substrate having the shortest processing time with the processing numbers of substrates corresponding to the transfer parameters. The processing number of substrates determined based on the recipe may be obtained by referring to the recipe set for the substrate after the substrate is mounted on the mounting unit. The substrate processing unit may be provided on each of multiple branched paths branched from a transfer path of the substrate between the mounting unit and the processing modules, the substrate transfer device may include an independent substrate transfer device configured to transfer the substrate with respect to the substrate processing unit provided on each branched path; and a common substrate transfer device configured to transfer the substrate through a common transfer path connected to the multiple branched paths, and the parameter selecting unit may specify, when selecting a transfer parameter of controlling the independent substrate transfer device, the processing number of substrates determined based on the recipe of the substrate having the shortest processing time except for the processing modules provided on the branched paths other than the branched path where the independent substrate transfer device is provided. The parameter selecting unit may specify the processing number of substrates determined based on the recipe of the substrate having the shortest processing time from a transfer schedule in which a transfer order of the substrates is listed in time series by matching the substrates mounted on the mounting unit to the processing modules as transfer destinations of the substrates through a transfer path. In each of the transfer parameters stored in the parameter storage unit, a set value of an acceleration of the substrate transfer device together with the set value of the operating speed thereof may correspond to the processing number of substrates per a unit time in the substrate processing unit.

In accordance with the various aspects and embodiments, there are prepared multiple sets of transfer parameter in which a set value of an operating speed of the substrate transfer device corresponds to the processing number of substrates per a unit time. Since the substrate transfer device is controlled based on a set value of a transfer parameter selected to minimize the operating speed without imposing any restriction on the actual processing number of substrates per a unit time determined based on a recipe corresponding to the process performed on the substrate, a load applied to the substrate transfer device may be minimized.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 6 is a list of transfer parameters used in controlling a wafer transfer device provided in the liquid processing apparatus;

FIG. 7 is a diagram showing example set values of a transfer parameter;

FIG. 10 is a diagram illustrating an example processing recipe indicating the content of processes to be performed on a wafer;

FIG. 11 is a flow chart for describing a sequence of an operation for setting information on the processible number of wafers;

FIG. 12 is a flow chart for describing a sequence of an operation for setting an operating speed of the wafer transfer device or the like;

DETAILED DESCRIPTION

Figure 1:
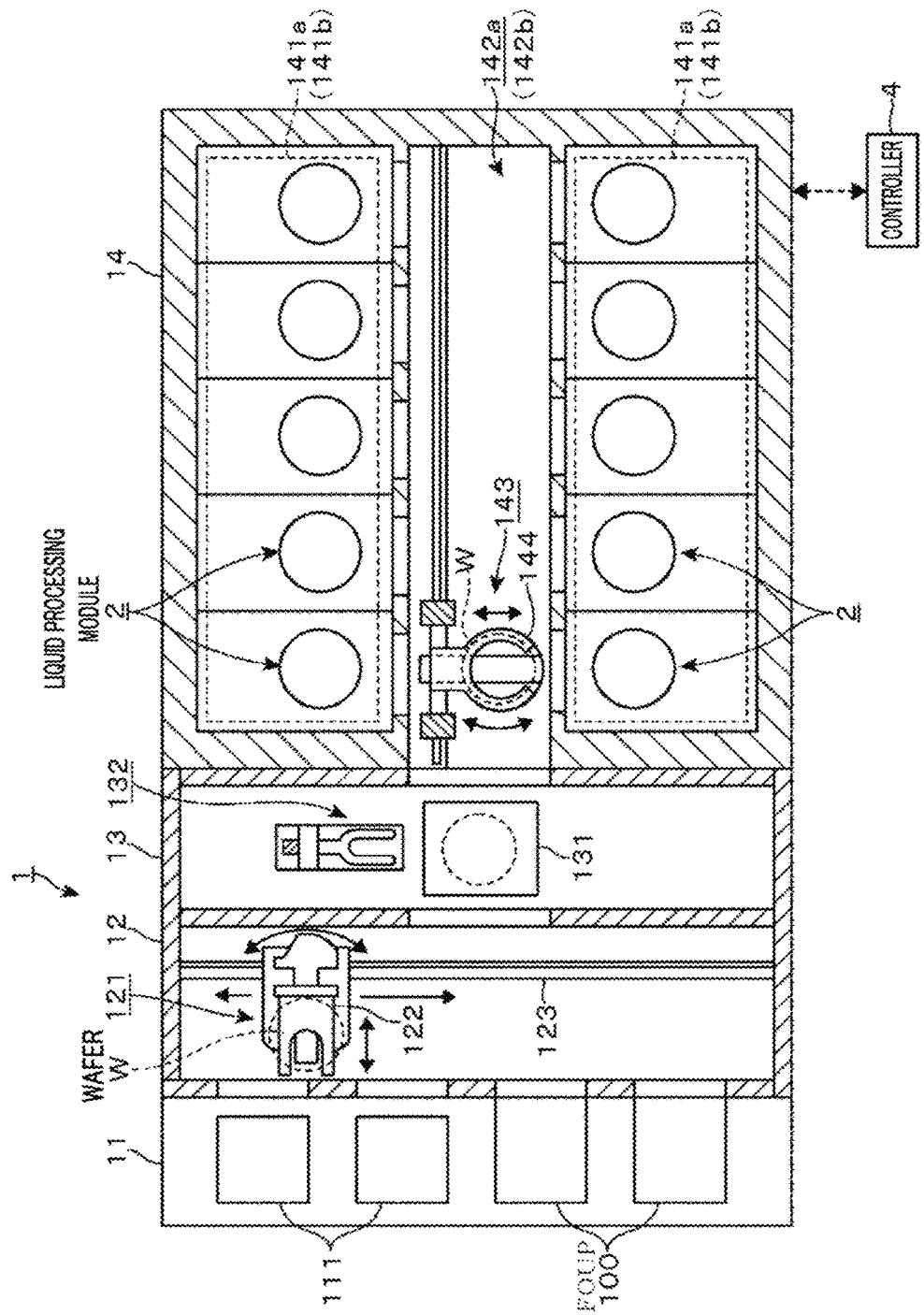
FIG. 1 is a plane view of a liquid processing apparatus in accordance with an example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Figure 2:
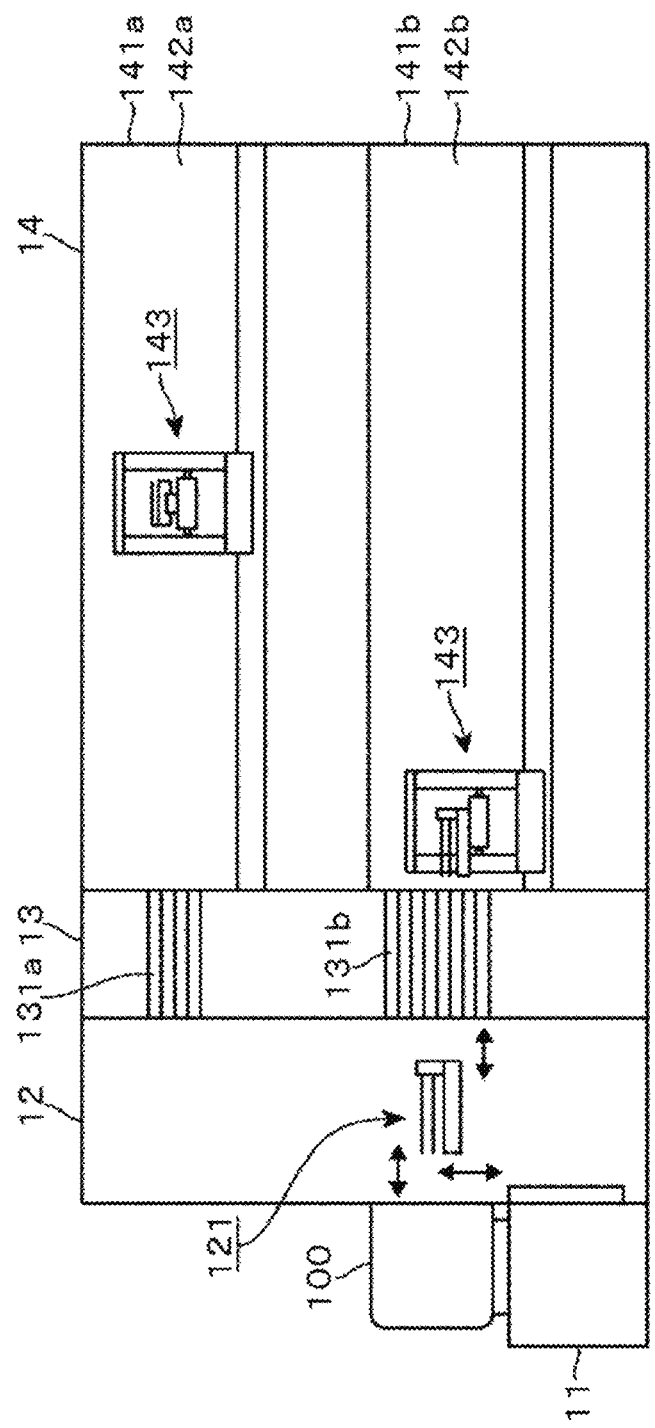
FIG. 2 is a longitudinal side view of the liquid processing apparatus.

Hereinafter, an example embodiment will be descried with respect to a liquid processing apparatus 1 configured to clean a wafer W serving as a substrate. As depicted in FIG. 1 and FIG. 2, the liquid processing apparatus 1 includes a mounting block 11, a loading/unloading block 12, a transit block 13; a liquid processing block 14, and transfer blocks 142a and 142b. The mounting block 11 is configured to mount thereon FOUPs 100 as carriers each of which accommodates therein a multiple number of wafers W. The loading/unloading block 12 is configured to load and unload the wafer W into and from the FOUP 100 mounted on the mounting block 11. The transit block 13 is configured to deliver the wafer W between the loading/unloading block 12 and the liquid processing block 14 positioned at the rear end thereof. The liquid processing block 14 is configured to perform a liquid process on the wafer W. The transfer blocks 142a and 142b are configured to transfer the wafers W between liquid processing modules 2 provided in the liquid processing block 14.

Figure 3:
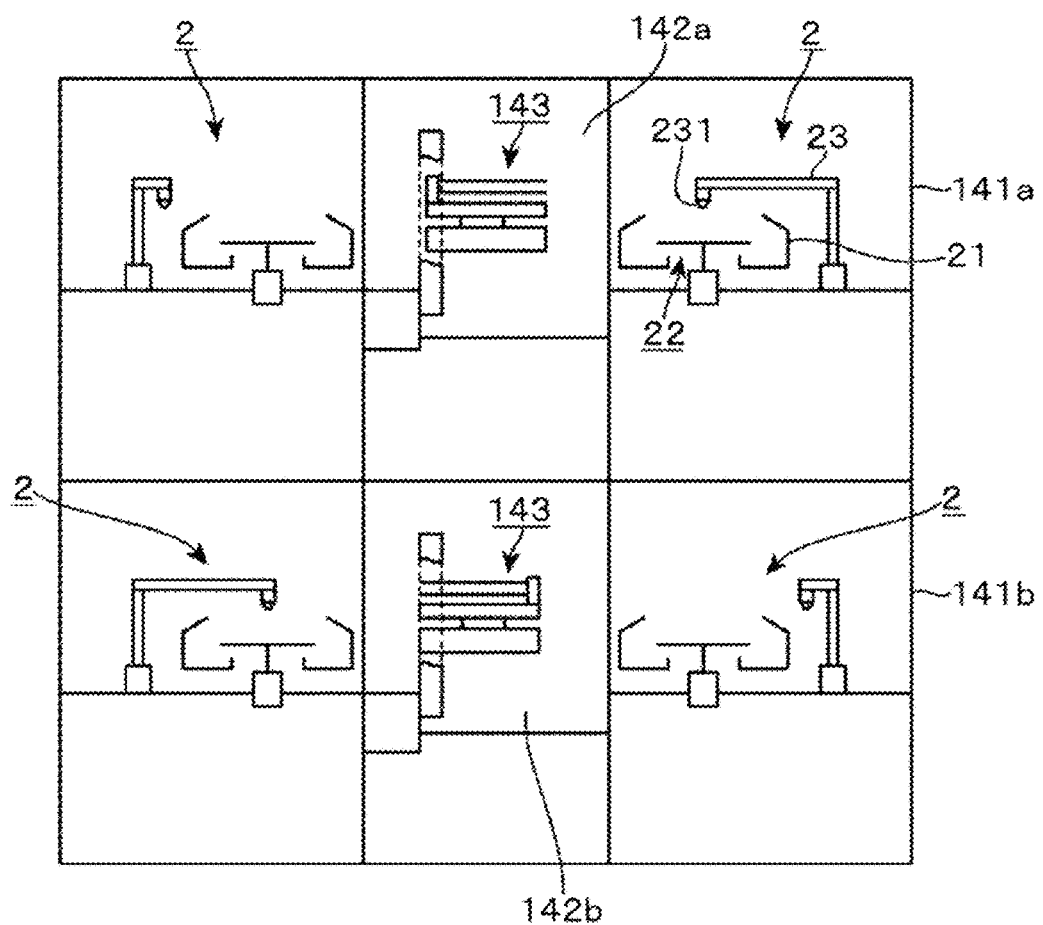
FIG. 3 is a longitudinal cross sectional front view of the liquid processing apparatus.

The liquid processing block 14 corresponds to a substrate processing unit in the present example embodiment. As shown in FIG. 2 and FIG. 3, the liquid processing block 14 includes a first processing block 141a at an upper side thereof and a second processing block 141b at a lower side thereof. That is, the processing blocks 141a and 141b are vertically stacked on top of each other. A multiple number of liquid processing modules 2 are provided in each of the processing blocks 141a and 141b. Accordingly, a multiple number of wafers W can be processed in parallel.

Further, with the mounting block 11 positioned at the front end, the mounting block 11, the loading/unloading block 12, the transit block 13 and the liquid processing block 14 are placed adjacent to each other in this sequence.

The mounting block 11 is configured to mount thereon the FOUPs 100 each of which accommodates the multiple number of wafers W in a horizontal posture. That is, in the present example embodiment, the mounting block 11 corresponds to a mounting unit on which the wafers W are mounted while being accommodated in the FOUPs 100. The loading/unloading block 12 is configured to transfer the wafer W taken out of the FOUP 100. The transit block 13 is configured to deliver the wafer W. The loading/unloading block 12 and the transit block 13 may be accommodated in a housing.

The loading/unloading block 12 includes a wafer transfer device 121. The wafer transfer device 121 includes a transfer arm 122 configured to hold thereon a wafer W; and a device configured to move the transfer arm 122 in a forward-backward direction (X direction). Further, the wafer transfer device 121 further includes a device configured to be moved along a horizontal guide 123 (see FIG. 1) extended in an arrangement direction (Y direction) of the FOUPs 100; a device configured to be moved along a non-illustrated vertical guide provided in a vertical direction (Z direction); and a device configured to rotate the transfer arm 122 about a vertical axis (in a θ direction) on a horizontal plane. The wafer transfer device 121 is configured to transfer the wafer W between the FOUP 100 and the transit block 13.

The transit block 13 includes a transit shelf 131 on which the wafers W are mounted. As illustrated in FIG. 2, the transit shelf 131 includes a first transit shelf 131a at an upper side thereof and a second transit shelf 131b at a lower side thereof. The first transit shelf 131a is used to load and unload the wafer W into/from the upper-side first processing block 141a, and the second transit shelf 131b is used to load and unload the wafer W into/from the lower-side second processing block 141b. A wafer W to be processed in the first processing block 141a is temporarily mounted on the lower-side second shelf 131b, and then, is moved to and mounted on the first transit shelf 131a by a moving/mounting device 132 (see FIG. 1). Here, the moving/mounting device 132 is configured to be movable up and down in the vertical direction (Z direction) and includes a transfer arm 133 which is configured to be movable in the forward-backward direction (X direction). Meanwhile, the processed wafer W is moved to and mounted on the second transit shelf 131b from the first transit shelf 131a by the moving/mounting device 132, and then, is returned back to the FOUP 100 by the wafer transfer device 121.

As stated above, the liquid processing block 14 includes the upper-side first processing block 141a and the lower-side second processing block 141b vertically stacked on top of each other. Each of the processing blocks 141a and 141b accommodates therein the multiple number of liquid processing modules 2. When viewed from the front side (mounting block 11), the multiple number of liquid processing modules 2 are arranged at the left and right side of each processing block 141a (141b) with the upper-side first transfer block 142a (the lower-side second transfer block 142b) therebetween.

In the present example embodiment, with a contact portion with the transit block 13 as a base, two rows of five liquid processing modules 2 are arranged in two levels along the transfer blocks 142a and 142b extended in the forward-backward direction. Accordingly, in the present example embodiment, the liquid processing apparatus 1 includes a total number of twenty liquid processing modules 2.

Each of the upper-side transfer block 142a and the lower-side transfer block 142b includes a wafer transfer device 143. These wafer transfer devices 143 have substantially the same configuration. By way of example, as shown in FIG. 1, each wafer transfer device 143 includes two transfer arms 144 configured to mount thereon the wafers W and configured to be slidable in the forward-backward direction (X direction) toward each liquid processing module 2. Further, each wafer transfer device 143 is configured to be movable in the arrangement direction (Y direction) of the liquid processing modules 2 and in the vertical direction (Z direction) and, also, to be rotatable about a vertical axis (in the θ direction).

Each liquid processing module 2 provided within the processing blocks 141a and 141b is configured to perform a liquid process on wafers W one by one through a spin process, for example. As depicted as an example in a longitudinal cross sectional front view of FIG. 3, in the liquid processing module 2, a wafer W, which is substantially horizontally held on a wafer holding unit 22 provided within a cup 21, is rotated about a vertical axis. Then, a nozzle 231 held on a nozzle arm 24 is moved into a space above the wafer W being rotated and supplies various chemical liquids (by way of non-limiting example, a SC1 solution (a mixed solution of ammonia and oxygenated water) or a dilute hydrofluoric acid (DHF) aqueous liquid as an acidic chemical liquid) or a rinse liquid in a preset sequence. As a result, the liquid process is performed on a top surface (a front surface in case that the wafer is placed with its front surface facing upward or a rear surface in case that the wafer is placed with its rear surface facing upward) of the wafer.

In the liquid processing apparatus 1 having the above-described configuration, a wafer W is loaded into the liquid processing apparatus 1 through a transfer path formed of a FOUP 100 on the mounting block 11→the loading/unloading block 12→the transit block 13→the transfer block 142a, the transfer block 142b→one of the liquid processing modules 2. Then, a preset liquid process is performed in the liquid processing module 2. Upon the completion of the liquid process, the wafer W is returned back into the FOUP 100 through the transfer path in reverse to that described above in case of loading the wafer W.

In the liquid processing apparatus 1 in accordance with the present example embodiment, depending on the number of wafers W processed per a unit time, it is possible to vary an operating speed of each of the wafer transfer device 121, the moving/mounting device 132 and the wafer transfer device 143 (hereinafter, these three devices will be referred to as "substrate transfer device") serving to transfer the wafers W within the aforementioned transfer path. Below, a configuration for altering the operating speed of the substrate transfer device will be elaborated.

Figure 4:
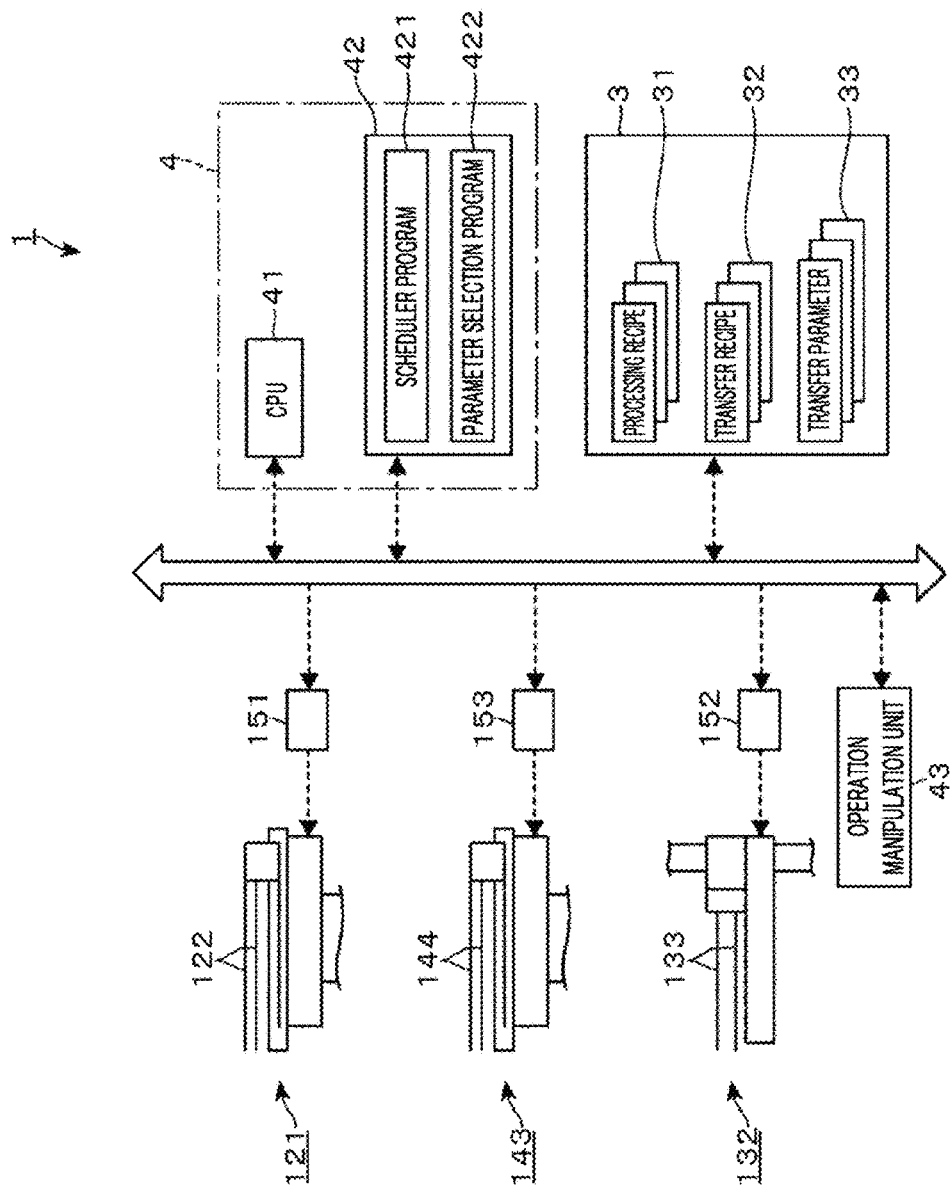
FIG. 4 is a block diagram illustrating an electric configuration of the liquid processing apparatus.

As depicted in a block diagram of FIG. 4 illustrating an electric configuration of the liquid processing apparatus 1, the liquid processing apparatus 1 includes a computer having a controller 4 and a memory 3. The controller 4 includes a CPU (Central Processing Unit) 41 and a program storage unit 42. Stored in the program storage unit 42 are programs including processes (commands) set for controlling the operations of the liquid processing apparatus 1, i.e., operations of taking out the wafer W from the FOUP 100 mounted on the mounting block 11, transferring the wafer W through the transfer path, performing a liquid process in each liquid processing module 2, transferring the processed wafer W through the transfer path, returning the wafer W back into the FOUP 100. The programs may be stored in a storage medium such as a hard disk, a compact disk, a magnet optical disk or a memory card and may be installed on the computer therefrom. In FIG. 4, although the program storage unit 42 and the memory 3 to be elaborated later are described as separated storage mediums, the program storage unit 42 and the memory 3 may be implemented by a common storage medium.

Further, the controller 4 is connected to an operation manipulation unit 43 formed of a touch-panel liquid crystal display or the like provided in the housing of the liquid processing apparatus 1.

As programs for changing the operating speed of the substrate transfer device (the wafer transfer device 121, the moving/mounting device 132 and the wafer transfer device 143), a scheduler program 421 for creating a transfer schedule in which transfer destinations and transfer sequences of wafers W accommodated in the FOUPs 100 are listed in time series; and a parameter selection program 422 for selecting an operating speed of each substrate transfer device are also stored in the program storage unit 42 in addition to the aforementioned programs for implementing the operations of the liquid processing apparatus.

As data for creating the transfer schedule of a wafer W, a transfer recipe 32 and a processing recipe 31 are stored in the memory 3. The transfer recipe 32 contains information indicating the transfer path (including the mounting block 11, the loading/unloading block 12, the transit block 13, and the transfer block 142a (142b)) of the wafer W between the FOUP 100 and the liquid processing module 2. In case of the blocks 13, 142a and 142b including multiple modules, a transfer destination may be selected while identifying the modules (i.e., the first transit shelf 131a and the second transit shelf 131b of the transit module 13, and the respective liquid processing modules 2 of the first processing block 141a and the second processing block 141b). Further, in FIG. 13 to FIG. 15, numerals 1 to 20 are assigned as the identification information of the liquid processing modules 2. The transfer recipe 32 may be selected from multiple kinds depending on the selection of the processing recipe 31 or the like.

The processing recipe 31 contains information regarding the content of the process (a liquid process or a dry process) performed in each liquid processing module 2, the kind of a supplied processing liquid (a chemical liquid or a rinse liquid), a rotational speed of the wafer W, a processing time, a sequence of processes, etc. The processing recipe 31 may be selected from multiple kinds depending on information set for the wafer W within the FOUP 100.

Figure 5:
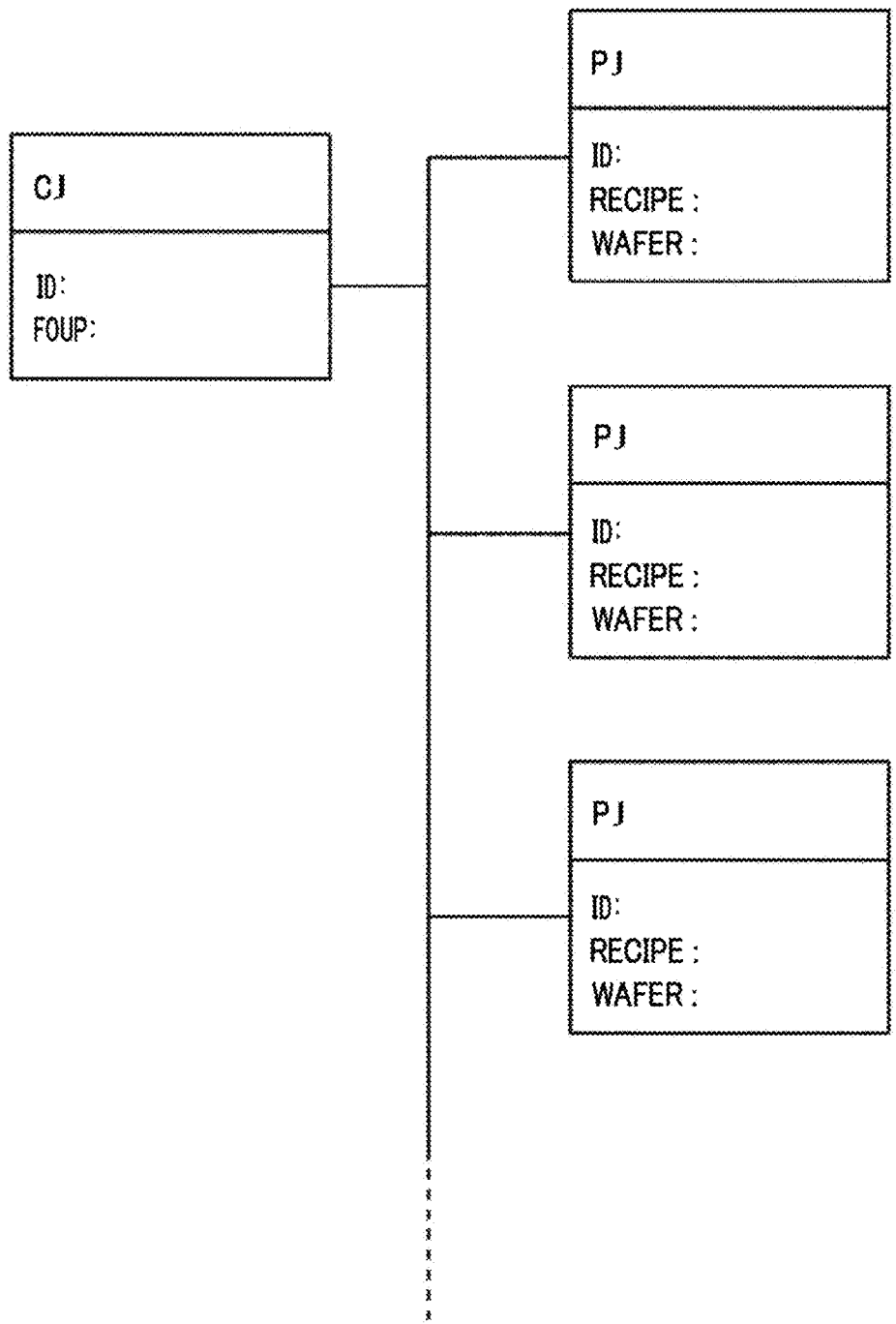
FIG. 5 is a diagram illustrating an example structure of processing information set for a wafer.

Meanwhile, the content of the process to be performed in the liquid processing apparatus 1 is previously set for the wafer W which is accommodated in the FOUP 100 and transferred within a factory to be subjected to a process in each processing apparatus. By way of example, as illustrated in FIG. 5, a control job CJ and a process job PJ are set for the wafer W within the FOUP 100. The PJ is set for each wafer W, and the CJ is a group of PJs. In the present example embodiment, the CJ is set for each FOUP 100. Information specifying the processing recipe to be performed on each wafer W is set on the PJ.

By way of example, each FOUP 100 has a configuration in which 25 levels of slots configured to hold wafers W in the horizontal posture are stacked in a vertical direction. As shown in a screen (displayed on, e.g., the operation manipulation unit 43) for setting and checking the CJs and the PJs, each CJ includes an ID as an identification number; and information specifying a FOUP for which the CJ having that ID is set.

A multiple number of PJs may be set in each CJ. Each PJ includes an ID as an identification number and information specifying a wafer W for which the PJ having that ID is set or information specifying a processing recipe 31 to be performed. The wafer W for which the PJ is set is specified by positions of slots within the FOUP 100.

The information regarding the CJ or the PJ is set for each FOUP 100 or each of wafers W accommodated in each FOUP 100. The controller 4 acquires this information through communication with a host computer that manages the individual apparatuses within the factory.

The controller 4 operated according to the scheduler program 421 selects the processing recipe 31 to be performed on the wafer W based on the information set in the PJ, and also selects the liquid processing module 2 capable of performing the process set in the processing recipe 31. Then, the controller 4 selects the transfer recipe 32 setting the transfer path of the wafer W between the FOUP 100 mounted on the mounting block 11 and the liquid processing module 2 selected based on the processing recipe 31.

In this way, the transfer paths of the respective wafers W within each FOUP 100 are determined in a transfer order of the wafers W, and the transfer schedule in which the transfer order of the wafers W is listed in time series is created. Through this transfer schedule, in each transfer process performed in the time series, the substrate transfer device (the wafer transfer device 121, the moving/mounting device 132 and the wafer transfer device 143) may specify which wafer W is to be transferred from which transfer source to which transfer destination (specifically, between the slots of the FOUP 100 on the mounting block 11 and the slots of the second transit shelf 131b for the wafer transfer device 121, between the slots of the second transit shelf 131b and the slots of the first transit shelf 131a for the moving/mounting device 132, between the slots of the first transit shelf 131a and each liquid processing module 2 of the first processing block 141a for the wafer transfer device 143 of the transfer block 142a, and between the slots of the second transit shelf 131b and each liquid processing module 2 of the second processing block 141b for the wafer transfer device 143 of the transfer block 142b) when transferring the wafers in time series.

Once the transfer schedule is created, the controller 4 may specify a process based on which a processing recipe 31 is being performed in each liquid processing module 2 within the liquid processing apparatus 1 at a time point when each substrate transfer device transfers the wafer W.

When setting the operating speed of the substrate transfer device (the wafer transfer device 121, the moving/mounting device 132 and the wafer transfer device 143), the controller 4 is configured to determine an appropriate operating speed of each substrate transfer device by referring to the transfer schedule.

The memory 3 stores transfer parameters 33 as data for setting an operation of the substrate transfer device. The transfer parameter 33 is prepared for each of the wafer transfer device 121, the moving/mounting device 132 and the wafer transfer device 143. As depicted in FIG. 6, a set value for each of multiple kinds of throughputs is stored in each transfer parameter 33. As shown in FIG. 6, in the present example embodiment, there are stored multiple sets of transfer parameters 33 in which the throughput is increased by, e.g., about 50 wph from a minimum throughput of, e.g., about 100 wph.

As stated above, in the present example embodiment, the operating speed of the substrate transfer device (the wafer transfer device 121, the moving/mounting 132 and the wafer transfer device 143) is controlled in the X, Y, Z and θ directions (except for the moving/mounting device 132 which does not move in the Y direction and in the θ direction). Here, a sliding direction of the transfer arms 122, 133 and 144 with respect to each substrate transfer device is defined as the X direction; a moving direction of the substrate transfer device orthogonal to this sliding direction when viewed from the plane view of FIG. 1 is defined as the Y direction; a vertical direction is set as the Z direction; and a rotational direction about a vertical axis is set as the θ direction. As illustrated in FIG. 7, operating speeds $v_X$, $v_Y$, $v_Z$ and $v_θ$ in these respective directions and accelerations $a_X$, $a_Y$, $a_Z$ and $a_θ$ in these respective directions required to reach the operating speeds may be selected and set in the transfer parameter 33 in the present example embodiment. Alternatively, without setting the accelerations, only the operating speeds may be set in the transfer parameter 33.

Figures 8, 9:
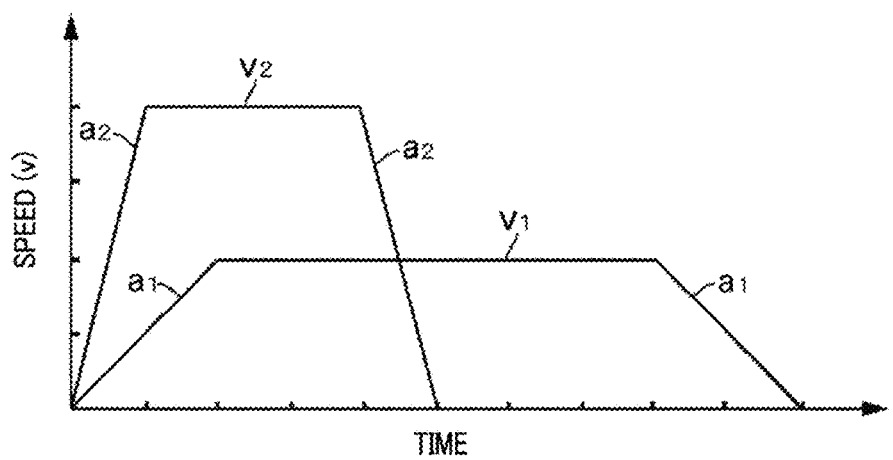
FIG. 8 is a diagram showing examples of transfer parameters set for different kinds of wafer transfer devices.
FIG. 9 is a diagram showing a variation in an operating speed of a wafer transfer device when a set value of a transfer parameter is changed.
Figure 12:
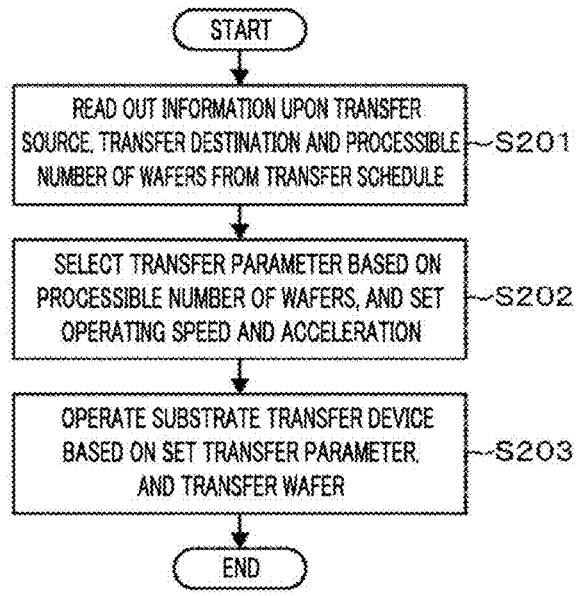

As illustrated in FIG. 8, according to the movable directions of the substrate transfer device, the operating speeds are changed by using the transfer parameters 33. As one example shown in FIG. 8, although the wafer transfer device 121 of the loading/unloading block 12 and the wafer transfer devices 143 of the transfer blocks 142a and 142b are movable in any of the X, Y, Z and θ directions, only the set values of the operating speeds and the accelerations in the X and Y directions, which have high influence on the throughput, may be changed by using the transfer parameters 33. Meanwhile, the operating speeds and the accelerations in the Z and θ directions may not be changed by using the transfer parameters 33 but may be fixed to certain values, for example. Further, in case of the moving/mounting device 132 configured to be movable only in the X and Z directions, set values of the operating speeds and the accelerations in both of these directions may be changed by using the transfer parameters 33.

The directions in which the operating speeds and the accelerations are set may be appropriately varied as required.

As the set values of the operating speeds and the accelerations are changed, an operating speed $v_1$ of the substrate transfer device and an acceleration $a_1$ required to reach the operating speed $v_1$ are changed to an operating speed $v_2$ and an acceleration $a_2$, respectively, in each transfer operation of the transfer schedule, as shown in FIG. 9. Further, a transfer time is adjusted such that distances (areas of respective trapezoids in FIG. 9) between the transfer sources and the transfer destinations specified in the transfer schedule become equal to each other.

As for the operating speeds and the accelerations, an operation check is performed previously. Thus, set values surely guaranteeing successful transfer of the wafers W by the substrate transfer device without the failure of the substrate transfer are stored in the transfer parameters 33. Further, each of the operating speeds and the accelerations is set such that a preset number of wafers W can be processed in the liquid processing block 14. Accordingly, the operating speeds and the accelerations may be set depending on the number of wafers W to be processed by the liquid processing block 14.

As stated above, in setting the operating speed of the substrate transfer device from the multiple transfer parameters 33, the controller 4 operated based on the parameter selection program 422 calculates a throughput of the liquid processing apparatus 1 based on the liquid process being performed in the liquid processing apparatus 1 and selects an appropriate transfer parameter 33 base on this calculated throughput. The controller 4 operated based on the parameter selection program 422 corresponds to a parameter selection unit in the present example embodiment. Below, an example method of calculating the throughput will be elaborated.

As stated above, if the transfer schedule is created, in a transfer process where the substrate transfer device transfers the wafer W, it is possible to find out a processing recipe 31 selected for a process being performed in the liquid processing module 2. As schematically shown in FIG. 10, information upon the kinds of processing liquids used in a chemical liquid process P1, a rinse process P2 and a dry process P3, a sequence of the processes, processing times, and so forth are set in the processing recipe 31. Accordingly, the controller 4 calculates a throughput of wafers W in the liquid processing apparatus 1 based on the information stored in the processing recipe 31. Then, based on this calculation result, the controller 4 selects, from the list of the transfer parameters illustrated in FIG. 6, a transfer parameter 33 that does not impose a restriction on the throughput of the liquid processing apparatus 1.

By way of example, assume that processing times of the chemical liquid process P1, the rinse process P2 and the dry process P3 performed according to a certain processing recipe 31 are $t_1$, $t_2$, $t_3$, respectively, as illustrated in FIG. 10 (here, in case of supplying multiple kinds of chemical liquids switchably, $t_1$ to $t_3$ may indicate total processing times of the chemical liquid process, the rinse process and the dry process, respectively). At this time, a net liquid processing time T except a time taken to transfer a wafer W between the liquid processing module 2 and the wafer transfer device 143 is the sum of these processing times $t_1$ to $t_3$.

Further, as the number of the liquid processing modules 2, in which the same liquid processes are performed in parallel, is increased, the throughput of the liquid processing apparatus 1 would be increased. Thus, a liquid processing time required to process a single sheet of wafer W in the entire liquid processing apparatus 1 can be calculated by dividing the liquid processing time T by the number of the liquid processing modules 2. Accordingly, the throughput of the liquid processing apparatus 1 may be calculated by dividing 3600 seconds (1 hour) by the time (i.e., the liquid processing time T/the number of the liquid processing modules 2) required to process the single sheet of the wafer W by the liquid processing apparatus 1 (see FIG. 10).

The controller 4 calculates the throughput of the liquid processing apparatus 1 for the substrate transfer device from the created transfer schedule, and compares the calculated throughput with the throughputs set in the transfer parameters 33. Among the group of transfer parameters 33 in which throughputs equal to or higher than the throughput of the liquid processing apparatus 1 are set, the controller 4 selects a transfer parameter 33 having a minimum throughput value. Hereinafter, for the convenience of explanation, a throughput set in the transfer parameter 33 is defined as "processible number of wafers"), and a throughput calculated based on the processing recipe 31 is defined as "processing number of wafers"), so that these two kinds of throughputs can be distinguished.

Further, as explained above with reference to FIG. 1 to FIG. 3, in the liquid processing apparatus 1 in accordance with the present example embodiment, the transfer path of a wafer W is branched at a portion thereof toward the first processing block 141a and the second processing block 141b. The substrate transfer device (the wafer transfer device 121, the moving/mounting device 132 and the wafer transfer devices 143) can be divided into independent substrate transfer devices and common substrate transfer devices. That is, the wafer transfer devices 143 configured to transfer wafers W within the branched paths (the transfer block 142a and the transfer block 142b) correspond to the independent substrate transfer devices. Further, the moving/mounting device 132 and the wafer transfer device 121 configure to transfer the wafers W through a common transfer path (FOUP 100—loading/unloading block 12—transit block 13) connected to these branched paths correspond to the common substrate transfer devices.

The controller 4 may select the transfer parameter 33 by setting a range of the liquid processing modules 2 as a criterion for calculating the processing number of wafers W for the independent substrate transfer devices (the wafer transfer devices 143) and the common transfer devices (the wafer transfer device 121 and the moving/mounting device 132) separately. This function will be elaborated in the following description of operations with reference to FIG. 13 to FIG. 15.

In the present example embodiment, the processible number of wafers W (e.g., information indicating '100 wph' or '250 wph' in FIG. 6) set in the corresponding transfer parameter 33 selected as stated above is specified in the transfer schedule along with information specifying a transfer source, a transfer destination and to-be-transferred wafer W serving as information for controlling the transfer process of the wafer W in each substrate transfer device. Processing may begin at block S101.

An operation of altering the operating speed of the substrate transfer device in the liquid processing apparatus 1 having the above-described configuration will be described with reference to FIG. 11 to FIG. 15.

At block S101 (Create Transfer Schedule of Wafers within FOUP), if a FOUP 100 accommodating therein wafers W to be processed is mounted on the mounting block 11 (START in FIG. 11), a transfer schedule of each wafer W is created in the transfer order of the wafers W (for example, starting from a wafer on the uppermost slot in the FOUP 100 toward wafers on lower slots) based on a PJ set for each of the respective wafers W and a processing recipe 31 specified by the PJ. Processing may proceed from block S101 to block S102.

At block S102 (Calculate Maximum Processing Number of Wafers in Liquid Processing Modules Covered by Each Substrate Transfer Device while Substrate Transfer Device Transfers Wafers), after the transfer schedule is created, while the substrate transfer device (the wafer transfer device 121, the moving/mounting device 132 and the wafer transfer devices 143) transfers each of the respective wafers W, a maximum processing number of wafers in liquid processing modules 2 covered by the substrate transfer device is calculated. Here, as for the term "liquid processing modules 2 covered by the substrate transfer device", the total number of twenty liquid processing modules 2 of the first processing block 141a and the second processing block 141b are selected as a coverage range of the common substrate transfer devices, i.e., the wafer transfer device 121 of the loading/unloading block 12 and the moving/mounting device 132 of the transit block 13. Further, as for the wafer transfer devices 143 as the independent substrate transfer devices respectively provided in the transfer blocks 142a and 142b, ten liquid processing modules 2 of the first processing blocks 141a are selected as a coverage range of the wafer transfer device 143 of the transfer block 142a, while ten liquid processing modules 2 of the second processing block 141b are selected as a coverage range of the wafer transfer device 143 of the transfer block 142b.

Further, the term "maximum processing number of wafers" refers to a processing number of wafers calculated when it is assumed that a liquid process having a large processing number of wafers (having a short liquid processing time T) is performed in all of the liquid processing modules in a coverage range in case that multiple kinds of liquid processes having different processing numbers of wafers (i.e., different liquid processing times T) are performed in parallel (coexisted) in the liquid processing modules 2 in the coverage range. Processing may proceed from block S102 to block S103.

At block S103 (Select, from Transfer Parameter List, Transfer Parameter Corresponding to Minimum Processible Number of Wafers among Groups of Transfer Parameters equal to or larger than Processing Number of Wafers), after the maximum processing number of wafers is calculated, a transfer parameter 33 having a minimum processible number of wafers is selected from a group of transfer parameters 33 equal to or larger than the calculated maximum processing number of wafers in the transfer parameter list (FIG. 6). Then, at block S104 (Set Information upon Minimum Processible Number of Wafers in Transfer Schedule along with Other Information), for the transfer processes of all wafers W of the substrate transfer device, information upon this minimum processible number of wafers is set in the transfer schedule along with other information (specifying transfer sources, transfer destinations and wafers W to be transferred by the substrate transfer device), and the operation of selecting the transfer parameter is finished (END).

At block S201 (Read out Information upon Transfer Source, Transfer Destination and Processible Number of Wafers from Transfer Schedule), upon the completion of creating the transfer schedule and selecting the transfer parameter 33, at a timing (START in FIG. 12) when each substrate transfer device actually starts transferring the wafer W, the information upon the transfer sources, the transfer destinations and the processible number of wafers regarding the wafers W to be transferred (which are set in the transfer schedule) is read out. Processing may proceed from block S201 to block S202. Then, at block S202 (Select Transfer Parameter based on Processible Number of Wafers, and Set Operating Speed and Acceleration), a transfer parameter 33 is selected based on the read out processible number of wafers, and transfer device controllers 151 to 153 as a transfer control unit set the parameter value for controlling the operating speed or the acceleration of each substrate transfer device. Processing may proceed from block S202 to block S203. At block S203 (Operate Substrate Transfer Device based on Set Transfer Parameter, and Transfer Wafer), based on the transfer parameter 33 set as stated above, the transfer device controllers 151 to 153 control the substrate transfer device (the wafer transfer device 121, the moving/mounting device 132 and the wafer transfer devices 143). The wafer W is transferred from the preset transfer source to the transfer destination at the set operating speed.

The transfer device controllers 151 to 153 correspond to the transfer control unit in the present example embodiment.

An operation of the liquid processing apparatus 1 in which the operating speed of the substrate transfer device is selected will be described with reference to the schematic diagrams of FIG. 13 and FIG. 14. For the simplicity of explanation, the description will be provided for the case of performing a liquid process by using only ten liquid processing modules numbered 1 to 10 in the lower-side second processing block 141*b* in the drawings.

Figure 13:
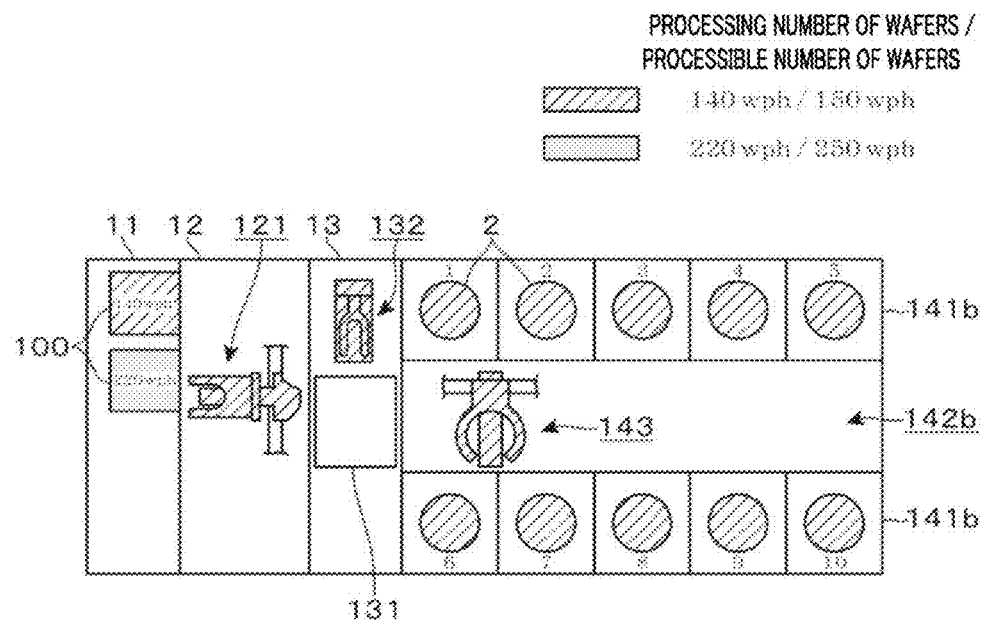
FIG. 13 is a first operation diagram for describing a wafer transfer operation in the liquid processing apparatus.
Figure 14:
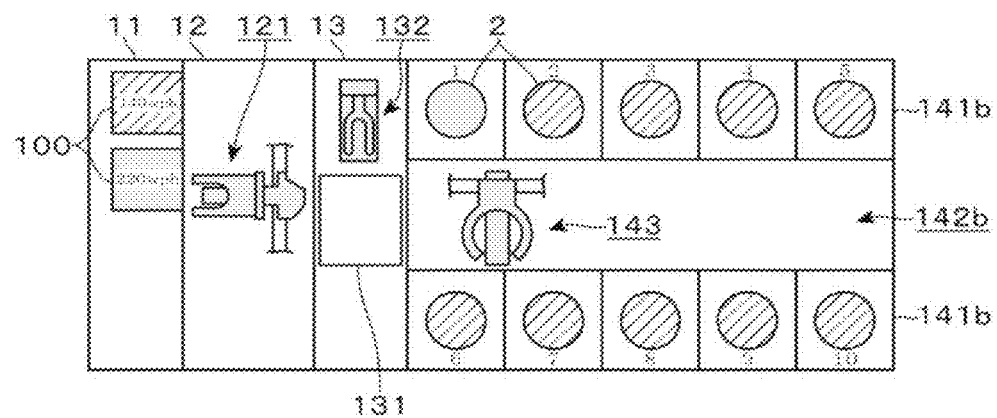
FIG. 14 is a second operation diagram for describing the wafer transfer operation.

Assume that a FOUP 100 (indicated in the hatch pattern) having the processing number of wafers of about 140 wph and a FOUP 100 (indicated in the shade pattern) having the processing number of wafers of about 220 wph are mounted on the mounting block 11 of FIG. 13. Within the liquid processing apparatus 1, wafers W are taken out of the FOUP 100 having the processing number of wafers of about 140 wph and processed by the respective liquid processing modules 2 (the liquid processing modules 2 that process the wafers W of about 140 wph are indicated in the hatch pattern).

At this time, the operating speeds of the wafer transfer device 121 of the loading/unloading block 12, the moving/mounting device 132 of the transit block 13 and the wafer transfer device 143 of the transfer block 142*b*, which serve as the substrate transfer device, are set by selecting a transfer parameter 33 having the smallest processible number of wafers of about 150 wph from the group of transfer parameters 33 equal to or larger than the processing number of wafers in the list shown in FIG. 6 (each substrate transfer device is indicated in the hatch pattern).

Accordingly, each substrate transfer device is operated at a speed which is slower than an operating speed at which a maximum throughput is achieved, and which does not restrict a processing speed (corresponding to the processing number of wafers) in the liquid processing modules 2. Therefore, as compared to the case of operating the substrate transfer device at a maximum speed all the time, overload of the substrate transfer device may be suppressed, so that wear-out of components may be reduced. Further, by appropriately selecting one of the preset transfer parameters 33, which has been previously set, accuracy of a transfer position can be checked or correction of a deviation from the transfer position can be made in a design process or a manufacturing process of the liquid processing apparatus 1. Thus, it may be possible to transfer a wafer W to an accurate position even after the operating speed is changed.

The process on the wafer W is performed as described above, and all the wafers W are taken out of the FOUP 100 having the processing number of wafers of about 140 wph and are loaded into the liquid processing apparatus 1. Then, a wafer W is taken out of the FOUP 100 having the processing number of wafers of about 220 wph. At this time, for the transfer schedule of the corresponding wafer W, a transfer parameter 33 equal to or larger than the maximum processing number of wafers of about 220 wph, among the processing number of wafers W of about 140 wph and about 220 wph, which are transferred within the liquid processing apparatus 1, is selected. That is, a transfer parameter 33 having the smallest processible number of wafers of about 250 wph may be selected from the group of transfer parameters 33 having the processible number of wafers equal to or larger than about 220 wph shown in FIG. 6.

As a result, the operating speed of the wafer transfer device 121 is changed to correspond to the processible number of wafers of about 250 wph, and the wafer transfer device 121 transfers wafers W based on this operating speed. Then, the operating speed of the moving/mounting device 132 of the transit block 13 or the wafer transfer device 143 of the transfer block 142*b* is also changed in sequence according to the transfer timing of the wafers W to correspond to the processible number of wafers of about 250 wph (each substrate transfer device is indicated in the shade pattern in FIG. 14). Accordingly, even during a period when the wafers W having the processing number of wafers of about 140 wph are being processed in the liquid processing modules 2 within the second processing block 141*b*, the operating speed of the substrate transfer device may be altered in sequence, so that wafers W of about 220 wph can be transferred into the liquid processing modules 2 without imposing any restriction on a process on the wafers of 220 wph.

Figure 15:
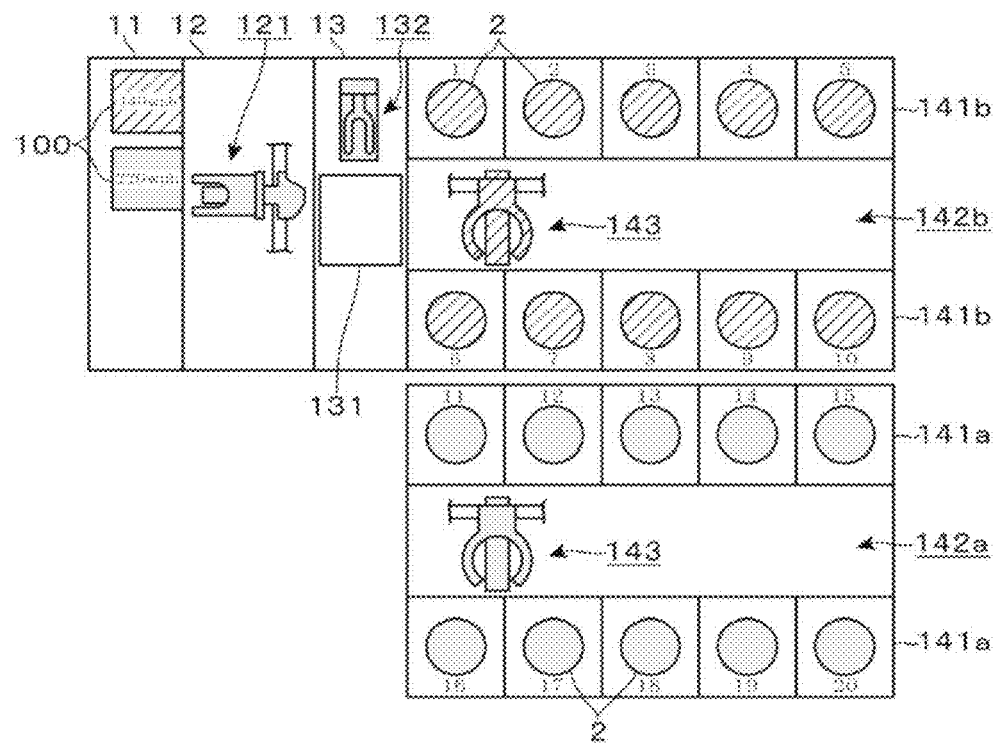
FIG. 15 is a third operation diagram for describing the wafer transfer operation.

Referring to FIG. 15, the following description will be provided for the case that different transfer parameters 33 are set for the common substrate transfer devices (the wafer transfer device 121 of the loading/unloading block 12, and the moving/mounting device 132 of the transit block 13) and the independent substrate transfer device (the wafer transfer devices 143 of the transfer blocks 142*a* and 142*b*). For the simplicity of explanation, it is assumed that the wafers W having the processing number of wafers of 140 wph are processed in the liquid processing modules 2 numbered 1 to 10 within the lower-side second processing block 141*b*, and the wafers W having the processing number of wafers of 220 wph are processed in the liquid processing modules numbered 11 to 20 within the upper-side first processing block 141*a*, as depicted in FIG. 15. Hatching and shade patterns applied to the FOUPs 100, the liquid processing modules 2 and the substrate transfer device indicate the same processing number of wafers and the same processible number of wafers as described in FIG. 13.

In this example embodiment, the wafer transfer device 121 of the loading/unloading block 12 and the moving/mounting device 132 of the transit block 13, which serve as the common transfer devices, transfer both of the wafers W of about 140 wph and the wafers W of about 220 wph as the processing number of wafers. Among them, based on the maximum processing number of wafers of about 220 wph, a transfer parameter 33 having the processible number of wafers of about 250 wph is selected, and the operating speed of the substrate transfer device is set.

Meanwhile, for the wafer transfer device 143 of the transfer block 142*b* serving as the independent substrate transfer device, based on the processing number of wafers of about 140 wph being processed in the liquid processing modules 2 of the second processing block 141*b*, a transfer parameter 33 having the processible number of wafers of about 150 wph is selected, and the operating speed of the wafer transfer device 143 is set. Further, for the wafer transfer device 143 of the transfer block 142*a*, based on the processing number of wafers of about 220 wph being processed in the liquid processing modules 2 of the first processing block 141*a*, a transfer parameter 33 having the processible number of wafers of about 250 wph is selected, and the operating speed of the wafer transfer device 143 is set.

As for the independent substrate transfer device provided in each branched path, the processing number of wafers may be set by delimiting the coverage range of the liquid processing modules 2 to which wafers W are to be transferred by each wafer transfer device 143 (except the liquid processing modules 2 provided in the other branched path). Accordingly, it is possible to suppress an excessively high operating speed from being set for the wafer transfer device 143. Meanwhile, as for the common substrate transfer devices which is provided in the common transfer path connected to the branched paths, by calculating the processing number of wafers for all of the liquid processing modules 2 to which wafers W are transferred through the common transfer path as the coverage range, it is possible to avoid a throughput of the entire liquid processing apparatus 1 from being deteriorated.

The following effects may be achieved by the liquid processing apparatus 1 in accordance with the present example embodiment. A multiple number of transfer parameters 33 for controlling the operating speed of the substrate transfer device (the wafer transfer device 121, the moving/mounting device 132 and the wafer transfer devices 143) are prepared. The substrate transfer device is controlled by selecting, depending on a processing time of a process performed on the wafer W, a transfer parameter 33 having a lowest operating speed and without restricting a throughput of the liquid processing apparatus 1. Thus, the overload on the substrate transfer device may be suppressed and minimized.

Here, the way to calculate the processing number of wafers may not be limited to the example described in FIG. 10. By way of example, the processing number of wafers may be calculated by considering a loading/unloading time of the wafer W with respect to the liquid processing module 2 in addition to the liquid processing time mentioned in FIG. 10. Further, as another example, the processing number of wafers may be previously set in a CJ or a PJ, and this information may be acquired from an external device.

The selection of the transfer parameter 33 may not be limited to the example where the transfer parameter 33 is set in the previously created transfer schedule. By way of example, when starting the transfer of the wafer W, the processing number of wafers may be calculated by checking operational statuses of the liquid processing modules 2 within the liquid processing apparatus 1, and the operating speed of the substrate transfer device may be set by selecting the transfer parameter 33 based on the calculated processing number of wafers.

Besides, the numerical value set in the transfer parameter 33 corresponding to the set value of the operating speed of the substrate transfer device may not be limited to the value directly indicating the throughput of wafers W. By way of non-limiting example, the transfer parameter 33 may be formed by combining values indirectly indicating throughputs and set values of the operating speeds in correspondence to each other, as in the combination of the liquid processing time T and the number of the processing modules 2 in the throughput calculation equation shown in FIG. 10.

Figure 16:
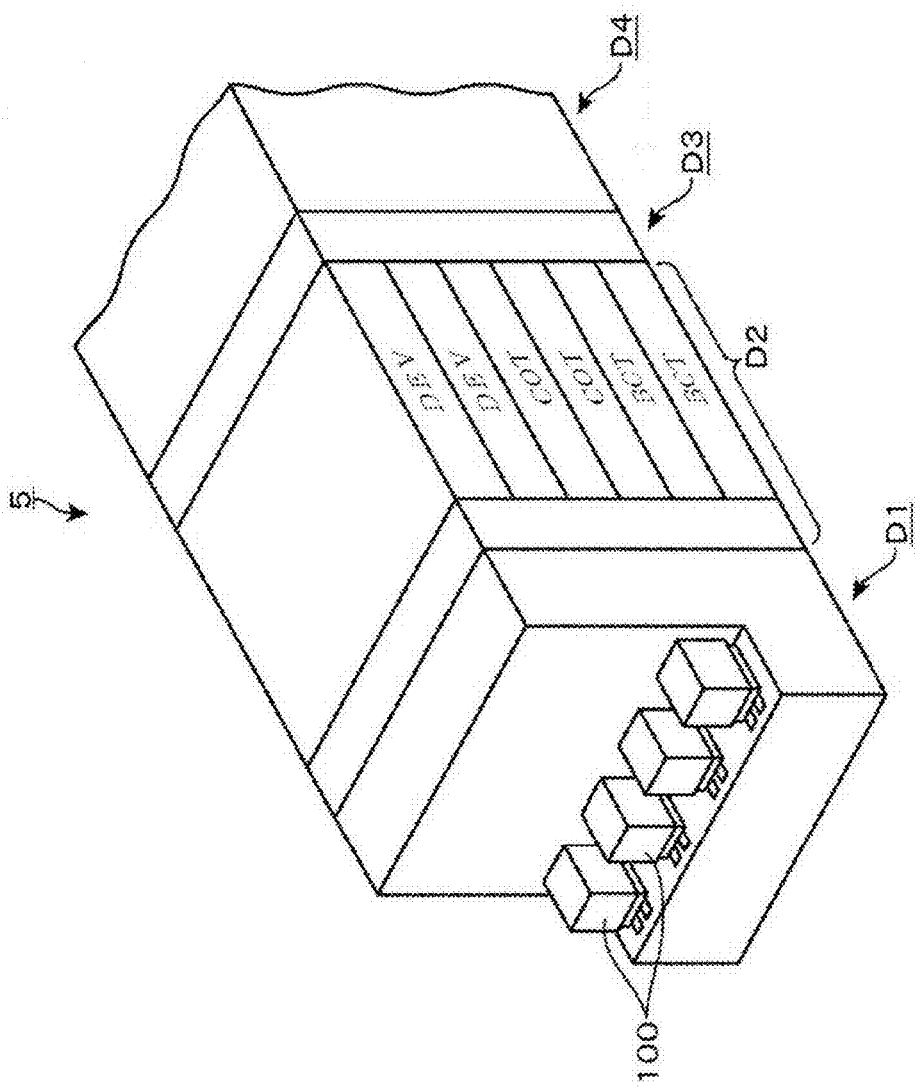
FIG. 16 is a perspective view of external appearance illustrating a coating/developing apparatus in accordance with another example embodiment.

Further, the substrate processing apparatus in accordance with the example embodiment may not be limited to the liquid processing apparatus 1 described with reference to FIG. 1 to FIG. 15. By way of example, the example embodiment may also be applicable to a coating/developing apparatus 5 shown in FIG. 16 and FIG. 17. The coating/developing apparatus of this present example includes a carrier block D1, a processing block D2 and an interface block D3. The carrier block D1 includes therein a wafer transfer device configured to load and unload a wafer W between a FOUP 100 and the coating/developing apparatus 5. The processing block D2 includes two levels of BCT layers configured to form an antireflection film; two levels of COT layers configured to form a resist film on the wafer W; and two levels of DEV layers configured to form a resist pattern on the wafer W after exposure. The interface block D3 is configured to transfer the wafer W between the respective processing layers and, also, to deliver the wafer W to and from an exposure apparatus D4 provided at the rear end thereof.

Towers T1 and T2 in the form of vertically stacked transit shelves are provided within the processing block D2 and the interface block D3, respectively. The wafer W is transferred between the processing layers by vertically delivering the wafer W by the moving/mounting device. Further, although another tower for transferring a wafer to/from the exposure device D4 or the like is provided in the interface block D3, illustration and description thereof is omitted here. Further, a liquid processing module configured to coat a source material of an antireflection film or a processing liquid such as a resist and a developing liquid; a heating module configured to perform heat treatment on the wafer W on which the processing liquid is coated; and so forth are provided in each of the vertically stacked processing layers. Further, a wafer transfer device configured to transfer the wafer in the processing layers is also provided in each of the processing layer.

A wafer W loaded into the coating/developing apparatus 5 is subjected to various processes while the wafer W is transferred in the order of carrier block D1→tower T1→BCT layer→tower T1→COT layer→interface block D3 (tower T2)→exposure apparatus D4→interface block D3 (tower T2)→DEV layer→tower T1→carrier block D1.

Figure 17:
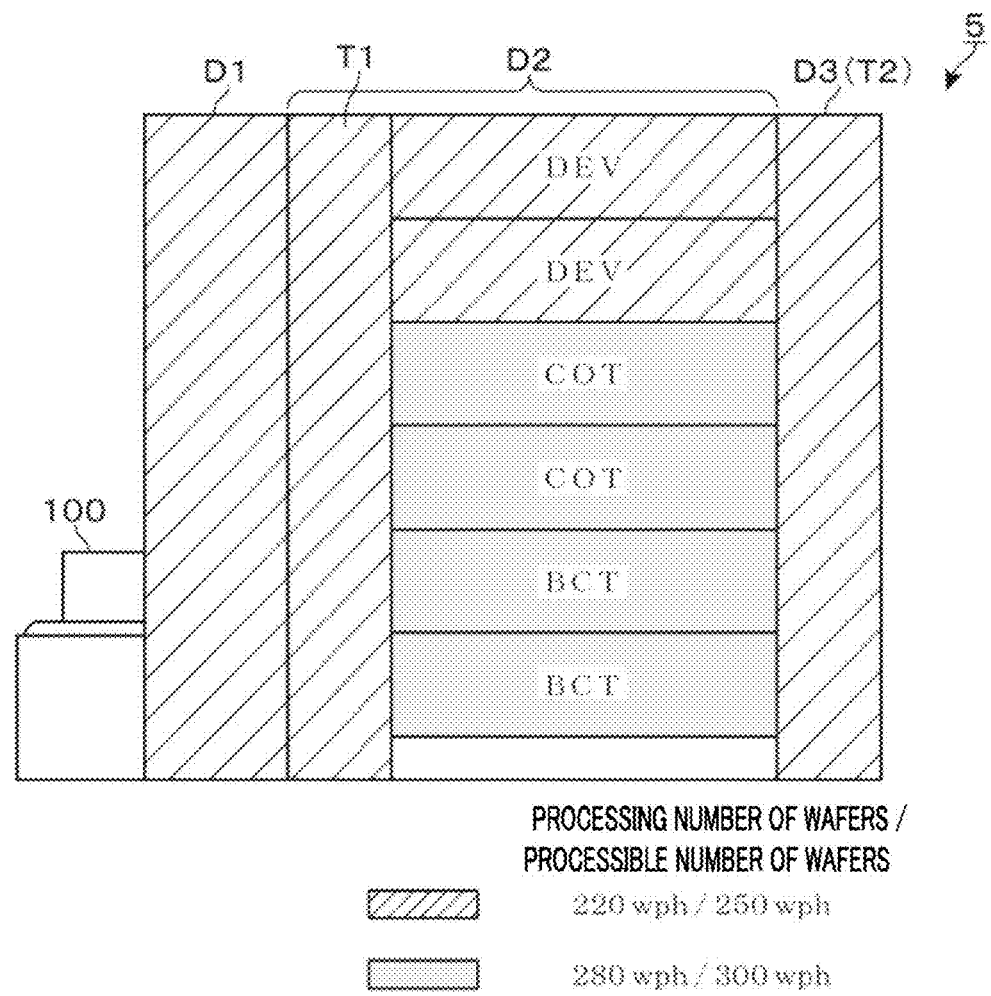
FIG. 17 is a diagram for describing a wafer transfer operation in the coating/developing apparatus.

In this configuration, assume that the processing number of wafers is altered from about 220 wph to about 280 wph by changing the FOUP 100 of which wafer W is taken out. Further, it is also assumed that wafers having the processing number of wafers of about 280 wph are processed in the BCT layer and the COT layer while wafers having the processing number of wafers of about 220 wph are still being processed in the DEV layer, as illustrated in FIG. 17. In this case, for each of the wafer transfer devices as independent substrate transfer devices provided in the BCT layer, the COT layer and the DEV layer where the processes are independently performed, a transfer parameter 33 having a processible number of wafers (e.g., about 300 wph for the BCT layer and the COT layer, and about 250 wph for the DEV layer) corresponding to the processing number of wafers processed in each corresponding processing layer is selected, and an operating speed of the wafer transfer device is set.

Meanwhile, a wafer transfer device or a moving/mounting device configured to commonly transfer the wafer W to the different processing layers deliver the wafer W within the towers T1 and T2 serves as a common substrate transfer device. For this common substrate transfer device, a transfer parameter 33 having a processible number of wafers corresponding to the maximum processing number of wafers of about 280 wph is selected, and an operating speed thereof is set.

Further, the substrate processing apparatus in accordance with the example embodiments may include various kinds of apparatuses such as an etching apparatus configured to perform an etching process on a wafer W; a film forming apparatus configured to perform a film forming process by, e.g., CVD (Chemical Vapor Deposition); and the like. Further, the kind of the substrate may not be limited to the semiconductor wafer W, but a glass substrate for a flat panel display or the like may also be used, for example.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

I claim:

1. A substrate processing apparatus, comprising:
a substrate processing unit including a plurality of processing chambers each configured to perform a process on a substrate;
a mounting unit configured to mount thereon at least one carrier, each carrier comprising substrates to be processed;
wherein the substrates of each carrier are processed in accordance with a processing recipe;
wherein each carrier possesses a first substrate number, the first substrate number indicating the number of substrates to be processed per unit time in the substrate processing unit according to the processing recipe;
a substrate transfer device provided between the mounting unit and the processing chambers, wherein the substrate transfer device comprises a transfer arm holding the substrate; and
a computer having:
a memory which stores a plurality second substrate numbers, each second substrate number indicating the number of substrates capable of being processed per unit time in the substrate processing unit for a given operating speed of the substrate transfer device; and
wherein the memory stores a mapping table that correlates each of the plurality of second substrate numbers with a respective operating speed of the substrate transfer device, and
a controller configured to:
compare a first substrate number with each of the plurality of second substrate numbers in the mapping table,
when the first substrate number is not equal to the second substrate number, select, from the mapping table, a smallest second substrate number from the plurality of second substrate numbers that is larger than the first substrate number; and
control the substrate transfer device based on the operating speed in the mapping table which corresponds to the smallest second substrate number.

2. The substrate processing apparatus of claim 1, wherein the first substrate number determined by the processing recipe is obtained by referring to a recipe set for the substrate after the carrier is mounted on the mounting unit.

3. The substrate processing apparatus of claim 1, wherein multiple branched paths are branched from a transfer path of the substrate between the mounting unit and the processing chambers,
the substrate transfer device is an independent substrate transfer device configured to transfer the substrate within each of the multiple branched paths, and
the substrate processing apparatus further comprises a common substrate transfer device configured to transfer the substrate through a common transfer path connected to the multiple branched paths.

4. The substrate processing apparatus of claim 1, wherein the controller specifies the first substrate number from a transfer schedule created based on the processing recipe, wherein a transfer order of the substrates is listed in the transfer schedule by matching the substrates mounted on the mounting unit to the processing chambers as transfer destinations of the substrates through a transfer path.

5. The substrate processing apparatus of claim 1, wherein, in the mapping table stored in the memory, a set value of an acceleration of the substrate transfer device together with the set value of the operating speed thereof corresponds to the number of substrates capable of being processed per unit time in the substrate processing unit.

* * * * *

UNITED STATES PATENT AND TRADEMARK OFFICE
CERTIFICATE OF CORRECTION

PATENT NO. : 10,395,957 B2  
APPLICATION NO. : 14/338558  
DATED : August 27, 2019  
INVENTOR(S) : Tomohiro Kaneko Page 1 of 1

It is certified that error appears in the above-identified patent and that said Letters Patent is hereby corrected as shown below:

In the Specification

Column 15, Line 57, "apparatus of" should be -- apparatus 5 of --.

Signed and Sealed this  
Nineteenth Day of November, 2019

Andrei Iancu  
*Director of the United States Patent and Trademark Office*